US011781906B2

(12) United States Patent
Gross et al.

(10) Patent No.: US 11,781,906 B2
(45) Date of Patent: Oct. 10, 2023

(54) SELF-ADAPTIVE ELECTROMAGNETIC ENERGY ATTENUATOR

(71) Applicant: ELBIT SYSTEMS LTD, Haifa (IL)

(72) Inventors: Noam Yona Gross, Haifa (IL); Ariela Donval, Haifa (IL)

(73) Assignee: ELBIT SYSTEMS LTD., Haifa (IL)

( * ) Notice: Subject to any disclaimer, the term of this patent is extended or adjusted under 35 U.S.C. 154(b) by 0 days.

(21) Appl. No.: 17/902,173

(22) Filed: Sep. 2, 2022

(65) Prior Publication Data

US 2023/0139136 A1    May 4, 2023

Related U.S. Application Data

(63) Continuation of application No. PCT/IB2021/051830, filed on Mar. 4, 2021.

(30) Foreign Application Priority Data

Mar. 5, 2020 (IL) .......................................... 273118

(51) Int. Cl.
*G01J 1/04* (2006.01)
*H04N 23/52* (2023.01)
(Continued)

(52) U.S. Cl.
CPC ........... *G01J 1/0418* (2013.01); *G01J 1/0448* (2013.01); *G01J 1/0488* (2013.01); *G01J 3/0213* (2013.01);
(Continued)

(58) Field of Classification Search
CPC ...... G01J 1/0418; G01J 1/0448; G01J 1/0488; G01J 3/0213; G01J 3/108;
(Continued)

(56) References Cited

U.S. PATENT DOCUMENTS 6,856,005 B2   2/2005 Yoshikawa et al.
7,005,669 B1   2/2006 Lee
(Continued)

FOREIGN PATENT DOCUMENTS

CN   106847952 A    6/2017
DE   102011122169 B4   3/2018
(Continued)

OTHER PUBLICATIONS

2nd IL office action dated Feb. 16, 2021 re IL 273118.
(Continued)

*Primary Examiner* — Kevin K Pyo
*Assistant Examiner* — Don J Williams
(74) *Attorney, Agent, or Firm* — The Roy Gross Law Firm, LLC; Roy Gross

(57) ABSTRACT

Aspects of embodiments pertain to a sensing systems configured to receive scene electromagnetic (EM) radiation comprising a first wavelength (WL1) range and a second wavelength (WL2) range. The sensing system comprises at least one spectral filter configured to filter the received scene EM radiation to obtain EM radiation in the WL1 range and the WL2 ranges; and a self-adaptive electromagnetic (EM) energy attenuating structure. The self-adaptive EM energy attenuating structure may comprise material that includes nanosized particles which are configured such that high intensity EM radiation at the WL1 range incident onto a portion of the self-adaptive EM energy attenuating structure causes interband excitation of one or more electron-hole pairs, thereby enabling intraband transition in the portion of the self-adaptive EM energy attenuating structure by EM radiation in the WL2 range.

20 Claims, 7 Drawing Sheets

(51) Int. Cl.

| | |
|---|---|
| *H04N 23/11* | (2023.01) |
| *G01J 3/02* | (2006.01) |
| *G01J 3/10* | (2006.01) |
| *G02B 5/20* | (2006.01) |
| *B82Y 15/00* | (2011.01) |
| *B82Y 20/00* | (2011.01) |
| *G01J 1/02* | (2006.01) |

(52) U.S. Cl.
CPC ............ *G01J 3/0237* (2013.01); *G01J 3/108* (2013.01); *G02B 5/206* (2013.01); *G02B 5/208* (2013.01); *H04N 23/11* (2023.01); *H04N 23/52* (2023.01); *B82Y 15/00* (2013.01); *B82Y 20/00* (2013.01); *G01J 2001/0276* (2013.01); *G02B 2207/101* (2013.01)

(58) Field of Classification Search
CPC ....... G01J 2001/0276; G02B 2207/101; B82Y 20/00; B82Y 15/00; H04N 23/11; H04N 23/52

See application file for complete search history.

(56) References Cited

U.S. PATENT DOCUMENTS

| | | | |
|---|---|---|---|
| 7,326,908 | B2 | 2/2008 | Sargent et al. |
| 8,071,945 | B2 | 12/2011 | Krishna et al. |
| 8,455,808 | B1 | 6/2013 | Frolov et al. |
| 8,574,685 | B1 | 11/2013 | Lewis et al. |
| 9,952,096 | B2 | 4/2018 | Kats et al. |
| 2004/0021138 | A1 | 2/2004 | Shields et al. |
| 2004/0108500 | A1 | 6/2004 | Yoshikawa et al. |
| 2005/0155641 | A1 | 7/2005 | Fafard |
| 2005/0236556 | A1 | 10/2005 | Sargent et al. |
| 2006/0132906 | A1 | 6/2006 | Wu et al. |
| 2007/0183474 | A1 | 8/2007 | Spariosu et al. |
| 2008/0225267 | A1 | 9/2008 | Murtagh et al. |
| 2009/0072144 | A1 | 3/2009 | Krishna et al. |
| 2009/0152664 | A1 | 6/2009 | Klem et al. |
| 2009/0268461 | A1 | 10/2009 | Deak et al. |
| 2009/0315016 | A1 | 12/2009 | Elam et al. |
| 2010/0213440 | A1 | 8/2010 | Shieh et al. |
| 2010/0264371 | A1 | 10/2010 | Nick |
| 2010/0301216 | A1 | 12/2010 | Vardi et al. |
| 2010/0314529 | A1 | 12/2010 | Sargent et al. |
| 2011/0002530 | A1 | 1/2011 | Zhuang et al. |
| 2011/0156184 | A1 | 6/2011 | Ninkov et al. |
| 2011/0168975 | A1 | 7/2011 | Cohen |
| 2011/0309238 | A1 | 12/2011 | Tian et al. |
| 2013/0027516 | A1* | 1/2013 | Hart ................ A61B 5/0071 348/45 |
| 2013/0342888 | A1 | 12/2013 | Donval et al. |
| 2014/0014902 | A1 | 1/2014 | Euliss et al. |
| 2014/0046083 | A1 | 2/2014 | Tilyou et al. |
| 2014/0079912 | A1 | 3/2014 | Euliss et al. |
| 2014/0273323 | A1 | 9/2014 | Kim |
| 2014/0299772 | A1 | 10/2014 | Guyot-Sionnest et al. |
| 2014/0312302 | A1 | 10/2014 | Oron et al. |
| 2014/0333750 | A1 | 11/2014 | Zhuang et al. |
| 2015/0116721 | A1 | 4/2015 | Kats et al. |
| 2015/0312455 | A1 | 10/2015 | Venkataraman et al. |
| 2015/0358567 | A1 | 12/2015 | Sargent et al. |
| 2015/0373261 | A1 | 12/2015 | Rodda et al. |
| 2016/0231440 | A1 | 8/2016 | Burke et al. |
| 2017/0012076 | A1 | 1/2017 | Chen et al. |
| 2017/0020390 | A1 | 1/2017 | Flitsch et al. |
| 2017/0041564 | A1 | 2/2017 | Konstantatos et al. |
| 2017/0084761 | A1 | 3/2017 | Cho et al. |
| 2017/0110608 | A1 | 4/2017 | Yang et al. |
| 2018/0047922 | A1 | 2/2018 | Forrest et al. |
| 2018/0151764 | A1 | 5/2018 | Auroux et al. |
| 2018/0197956 | A1 | 7/2018 | Lee et al. |
| 2018/0248058 | A1 | 8/2018 | Yakes et al. |
| 2018/0255212 | A1 | 9/2018 | Sprigg et al. |
| 2019/0043925 | A1 | 2/2019 | So et al. |
| 2019/0049369 | A1 | 2/2019 | Chow et al. |

FOREIGN PATENT DOCUMENTS

| | | |
|---|---|---|
| EP | 3438226 A1 | 2/2019 |
| KR | 101965529 B1 | 4/2019 |
| TW | 201010105 A | 3/2010 |
| WO | 2005017951 A2 | 2/2005 |
| WO | 2016181391 A1 | 11/2016 |
| WO | 2017017238 A1 | 2/2017 |
| WO | 2017044805 A1 | 3/2017 |
| WO | 2017171482 A1 | 10/2017 |
| WO | 2019035530 A1 | 2/2019 |
| WO | 2019068814 A1 | 4/2019 |

OTHER PUBLICATIONS

"3rd IL Office Action dated Jul. 15, 2021".
C.-H. Lin, C. W. Liu, "MOS Si/Ge photodetectors," Proc. SPIE 6368,Optoelectronic Devices: Physics, Fabrication, and Application III, 636806 (Oct. 12, 2006); doi: 10.1117/12.684994.
"Search Report dated Jul. 30, 2020 prepared by ILPO for IL application 273118".
Grim J.Q et al., "A sustainable future for photonic colloidal nanocrystals", Chem. Soc. Rev. 44, 5897-5914 (2015).
Guyot-Sionnest P. et al., "Intraband transitions in semiconductor nanocrystals", Appl. Phys. Lett. 72, 686 (1998).
IL examination report of dated Feb. 16, 2021 for IL273118.
Yaqi, J & Laser, & Ilps, Ijl & Bawi, Zainab. (2007). Nonlinear Optical Properties of CdS Thin Film Nanoparticles Using 2-Scan Technique. 9-14.
IL Office Action dated Aug. 2, 2020 in IL273118.
Padmaja, S. & S, Jayakumar & Balaji, R .. (2015). CdS:PMMA nanocomposite solid films with enhanced properties. Materials Technology. 30. 276-281. 10.1179/1753555714Y.0000000261.
Wang, Jun & Blau, Werner. (2009). Inorganic and hybrid nanostructures for optical limiting. Journal of Optics A: Pure and Applied Optics. 11. 10.1088/1464-4258/11/2/024001.
Tripman L. et al. "Size dependent fluorescence spectroscopy of nanocolloids of ZnO", J. Appl. Phys. 102, 063524 (2007).
"ISR, Written Opinion & Search Strategy for PCT/IB2021/051830".
Jeong K.S. et al. "Air-Stable n-Doped colloidal HgS quantum dots", J. Phys. Chem. Lett. 5, 1139-1143 (2014).
Klimov V.I. "Nanocrystal Quantum Dots", Los Alamos Science 28: 214-20 (2003).
Kovalenko M.V. et al. "Prospects of Nanoscience with Nanocrystals", ACS Nano, vol. 9, No. 2, 1012-1057 (2015).
Lhuillier E. et al. "Infrared Photodetection Based on Colloidal Quantum-Dot Films with High Mobility and Optical Absorption up to THz", Nano Lett. 16, 1282 (2016).
"S. Padmaja et al. "A comparative study on CdS: PEO and CdS: PMMA nanocomposite solid films", Materials Research Bulletin, vol. 80, Aug. 2016, pp. 36-43".
Qu J et al. "Intraband Mid-Infrared Transitions in Ag2Se Nanocrystals: Potential and Limitations for Hg-Free Low-Cost Photodetection", J. Phys. Chem. C 122, 18161 (2018).
"Sreeramulu Valligatla et al., "Nonlinear optical switching and optical limiting in colloidal CdSe quantum dots investigated by nanosecond Z-scan measurement", Optics & Laser Technology 84 (2 016 ) 87-93".
Sahu A. et al., "Quantum confinement in silver selenide semiconductor nanocrystals", Chem. Commun. 48, 5458-5460 (2012).
"S.Sauvage et al., "Resonant excitation of intraband absorption in InAs/GaAs self-assembled quantum dots", Journal of Applied Physics 84, 4356 (1998); https://doi.org/10.1063/1.368655 Submitted: May 12, 1998 . Accepted: Jul. 11, 1998 . Published Online: Oct. 27, 1998".
Schimpf A.M. et al. "Charge-Tunable Quantum Plasmons in Colloidal Semiconductor" Nanocrystals, ACS Nano, vol. 8, No. 1, 1065-1072, (2014).

(56) References Cited

OTHER PUBLICATIONS

Sean Keuleyan et al., Mid-infrared HgTe colloidal quantum dot photodetectors Nature Photonics vol. 5, pp. 489-493(2011).
Shen G. et al. "HgS and HgS/CdS Colloidal Quantum Dots with Infrared Intraband Transitions and Emergence of a Surface Plasmon", J. Phys. Chem. C 120, 11744-11753 (2016).
Shim M. et al., "n-type colloidal semiconductor nanocrystals", Nature 407, 981 (2000a).
Shim M. et al. "Long-Lived Delocalized Electron States in Quantum Dots A Step-Scan Fourier Transform Infrared study", J. Phys. Chem. B 104, 1494-1496 (2000b).
Wang C. et al. "Electrochromic semiconductor nanocrystal films", Appl. Phys. Lett. 80, 4 (2002).
Wang C. et al. "Electrochromic Nanocrystal Quantum Dots", Science 291, 2390, (2001).
Website visited on Jul. 3, 2020, https://www.edmundoptics.com/knowledge-center/application-notes/optics/the-correct-material-for-infrared-applications/.
Yi Zhang et al. Photoactivated CdTe/CdSe Quantum Dots as a Near Infrared Fluorescent Probe for Detecting Biothiols in Biological Fluids Analytical Chemistry 2009 81 (12), 5001-5007.
Extended European Search Report for European Patent Application No. EP21764434.3, dated Jul. 13, 2023, 8 pages.

\* cited by examiner

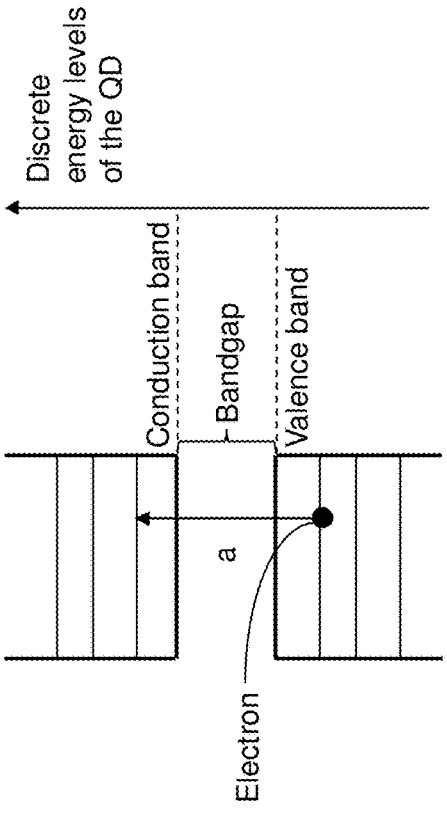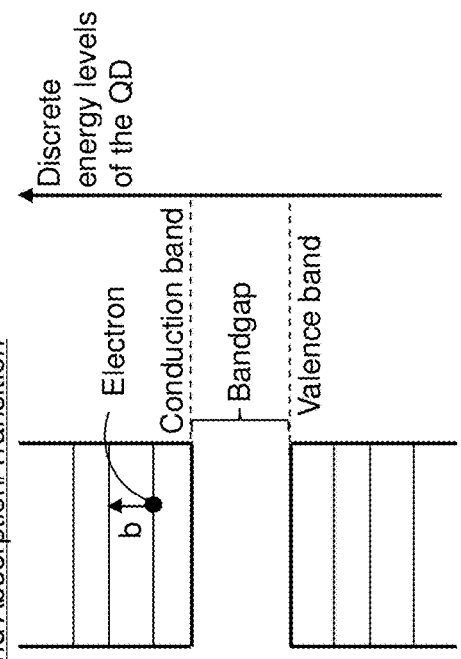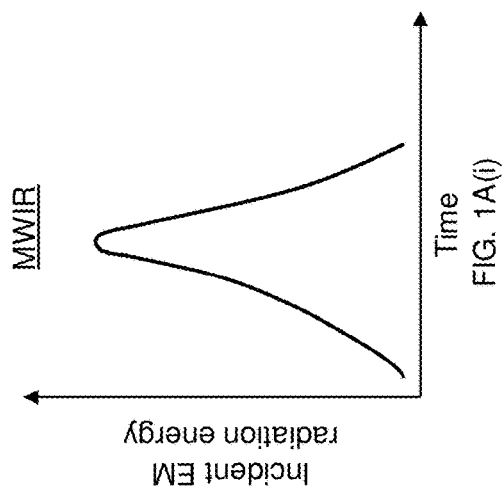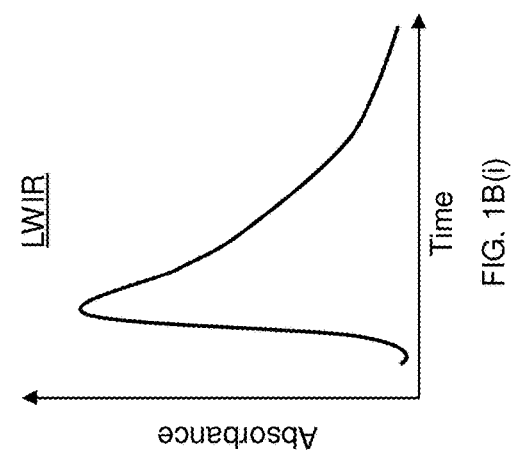
FIG. 1A(ii) FIG. 1B(ii)
FIG. 1A(i) FIG. 1B(i)

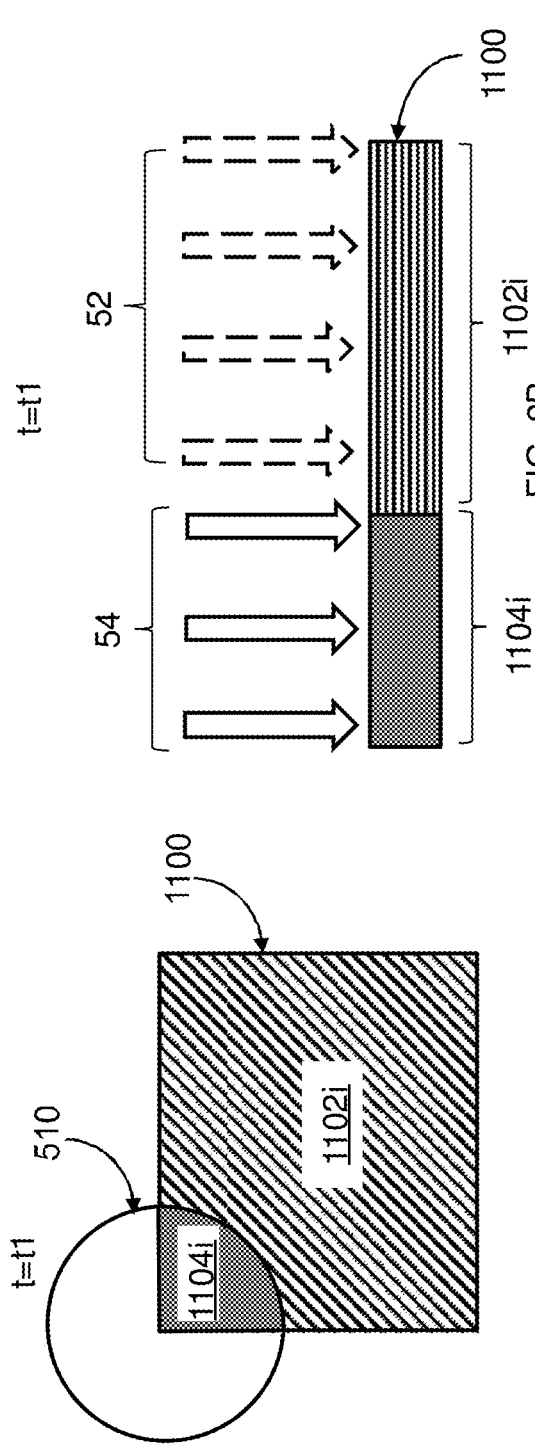
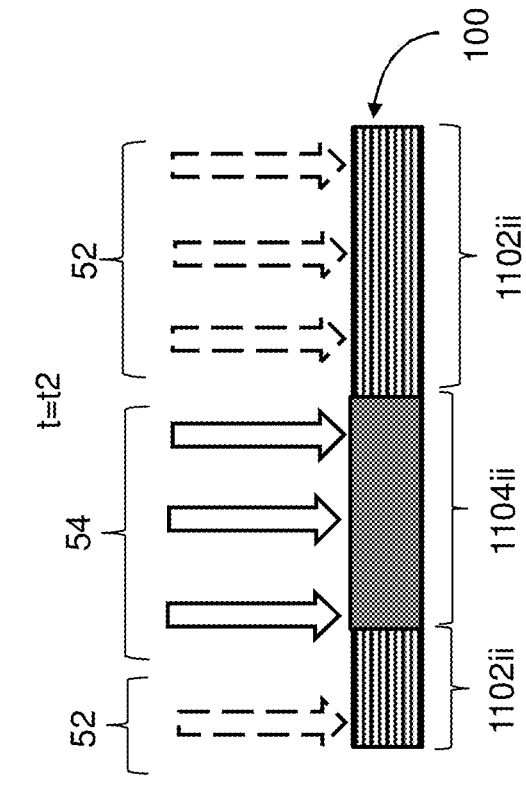
FIG. 2A
FIG. 2B
FIG. 2C
FIG. 2D

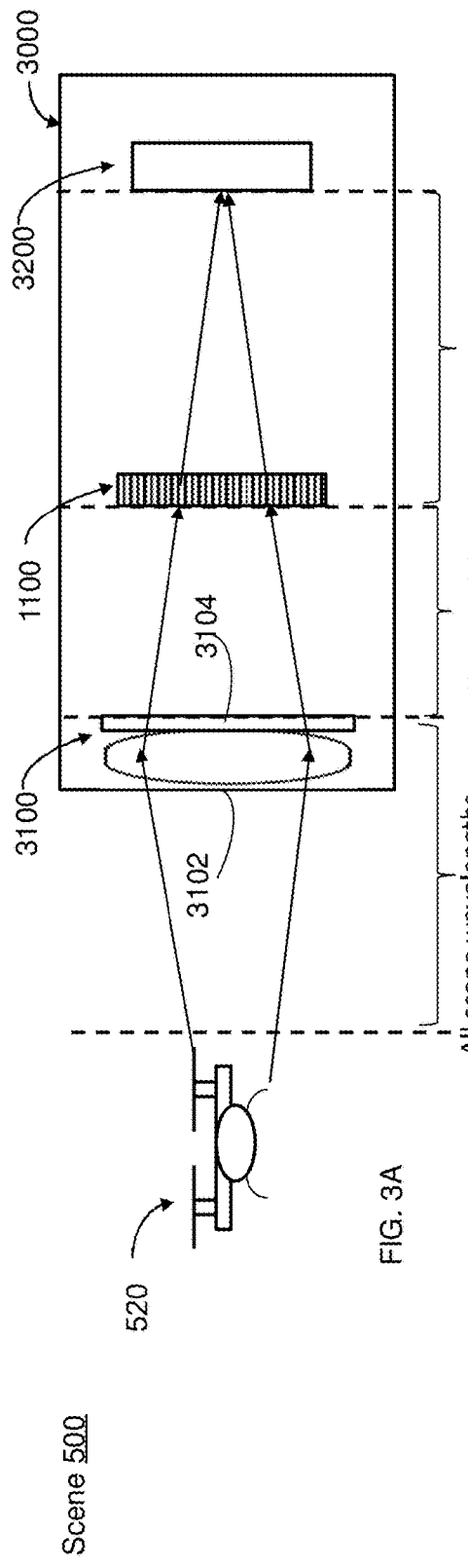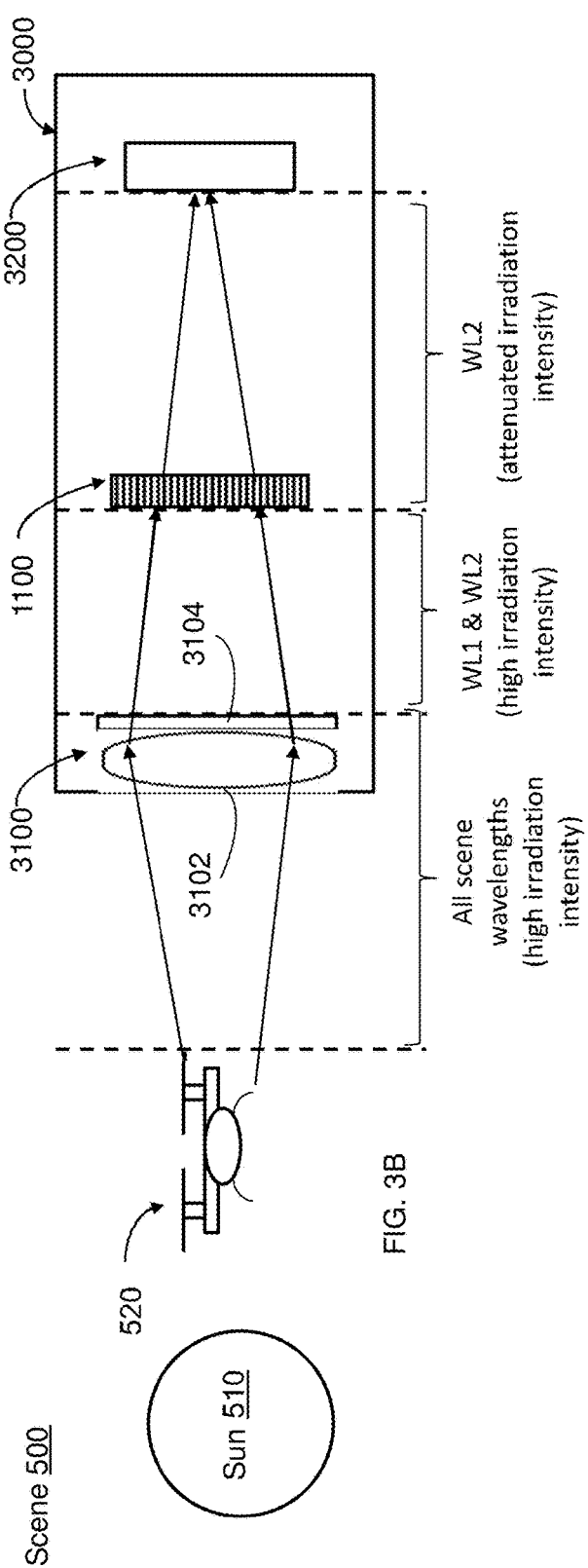

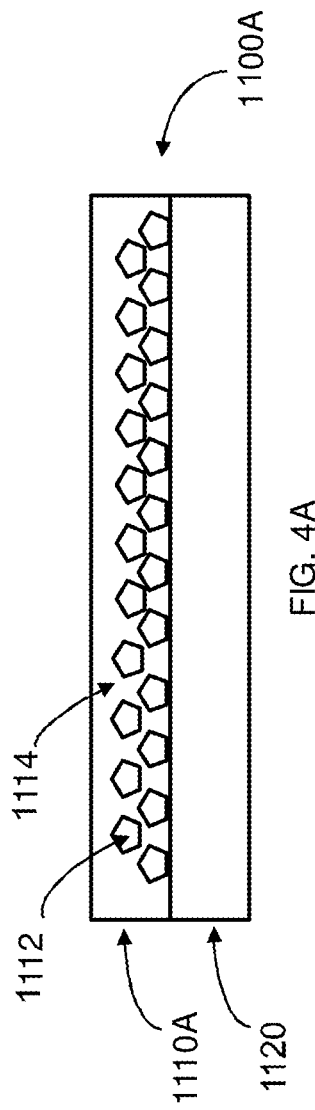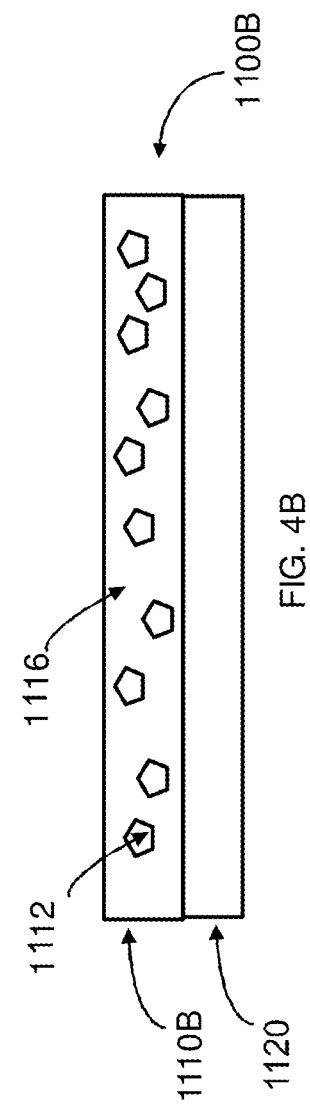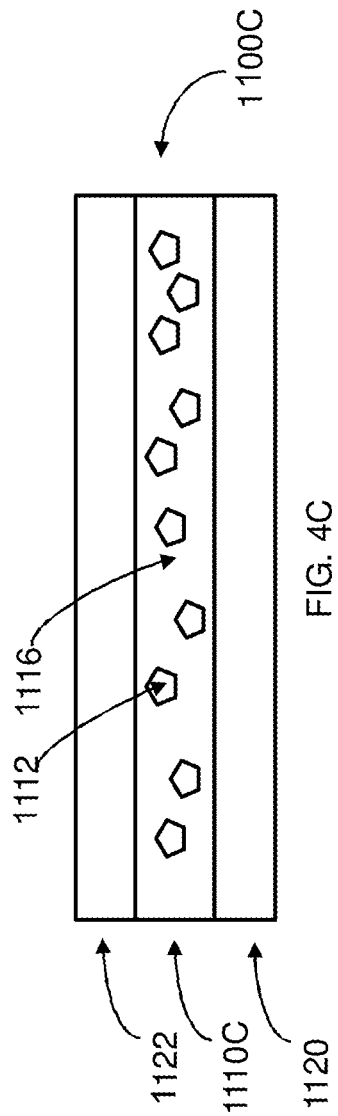

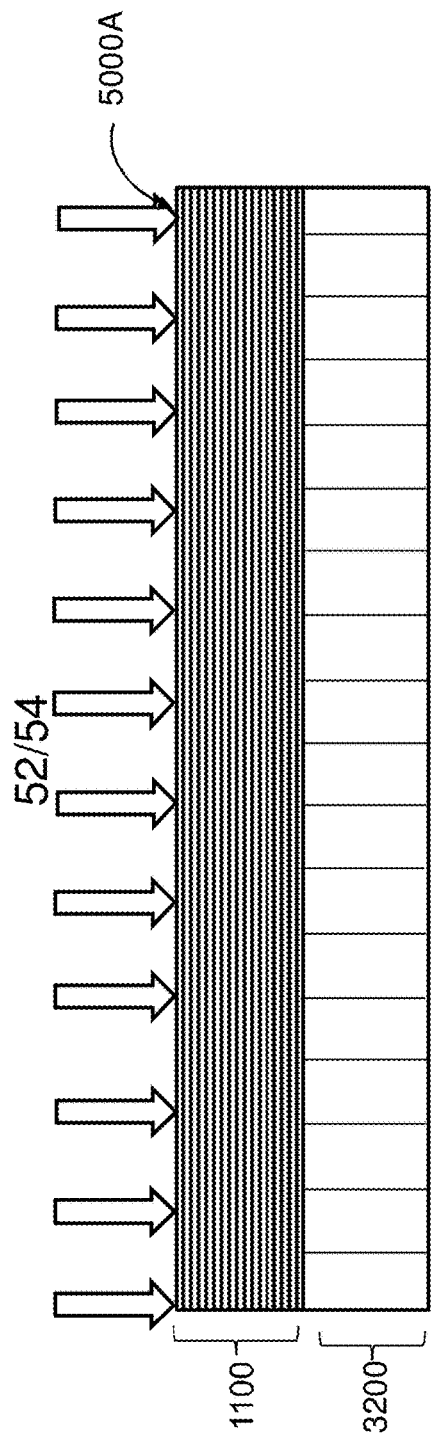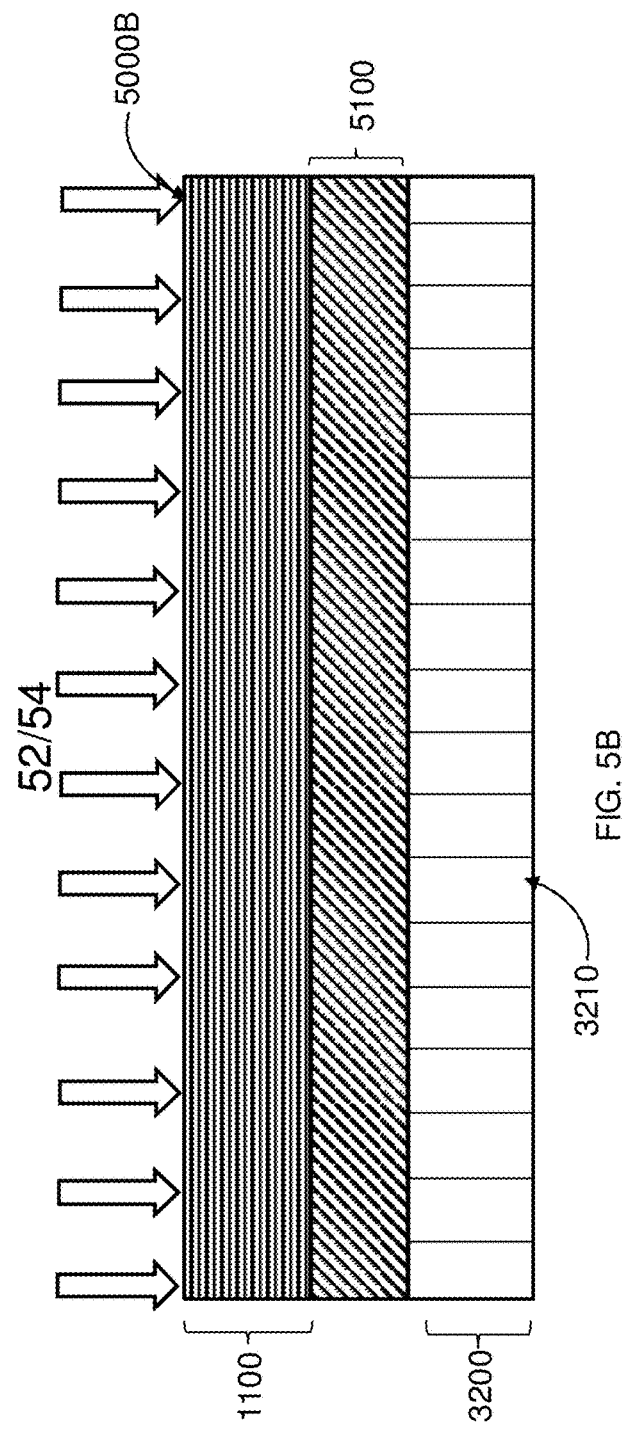

SELF-ADAPTIVE ELECTROMAGNETIC ENERGY ATTENUATOR

CROSS-REFERENCE TO RELATED APPLICATIONS

This application is a Bypass Continuation of PCT Patent Application No. PCT/IB2021/051830 having International filing date of Mar. 4, 2021, which claims priority from Israel Patent Application 273118, filed Mar. 5, 2020, titled "SELF-ADAPTIVE ELECTROMAGNETIC ENERGY ATTENUATOR" and which are all incorporated herein by reference in their entirety.

TECHNICAL FIELD

The present disclosure relates in general to devices, systems and methods for electromagnetic sensing applications.

BACKGROUND

Quantum detectors (also: photodetectors) are used in numerous applications including, for example, as infrared (IR) detectors/sensors for IR imaging.

In IR imaging applications, a photodetector converts electromagnetic radiation energy collected from a scene comprising objects into measurable electrical signals, for example, to generate an IR intensity map or image of the imaged scene for display to a user. An imaged object may be detectable due to differences in thermal radiation between the object and the ambient temperature of the scene in which the object is located.

Technical challenges associated with photodetectors can include overexposure and sensor damage due to high radiation intensities. For example, an IR sensor that is configured to image a certain IR wavelength range of interest may suffer from overexposure due to incident high-intensity radiation in the same wavelength range emitted by the sun.

The description above is presented as a general overview of related art in this field and should not be construed as an admission that any of the information it contains constitutes prior art against the present patent application.

BRIEF DESCRIPTION OF THE FIGURES

The figures illustrate generally, by way of example, but not by way of limitation, various embodiments discussed in the present document.

For simplicity and clarity of illustration, elements shown in the figures have not necessarily been drawn to scale. For example, the dimensions of some of the elements may be exaggerated relative to other elements for clarity of presentation. Furthermore, reference numerals may be repeated among the figures to indicate corresponding or analogous elements. References to previously presented elements are implied without necessarily further citing the drawing or description in which they appear. The figures are listed below.

FIG. 1A(i) is a graph qualitatively showing the intensity of Mid-Wave Infrared (MWIR) radiation incident onto an electromagnetic energy attenuator, as a function of time.

FIG. 1A(ii) is an energy diagram schematically showing the interband transition responsive to the MWIR radiation incident onto the self-adaptive electromagnetic energy attenuator.

FIG. 1B(i) is a graph qualitatively showing the Long Wave Infrared (LWIR) absorbance of the self-adaptive electromagnetic energy attenuator as a function of time.

FIG. 1B(i) is the energy diagram schematically showing the intraband transition responsive to LWIR radiation incident onto the self-adaptive electromagnetic energy attenuator.

FIG. 2A is a schematic back view illustration of self-adaptive electro-Magnetic (EM) energy attenuating structure at t=t1, according to an embodiment.

FIG. 2B is a schematic side view illustration of self-adaptive EM energy attenuating structure at t=t1, according to an embodiment.

FIG. 2C is a schematic back view illustration of self-adaptive EM energy attenuating structure at t=, according to an embodiment.

FIG. 2D is a schematic side view illustration of self-adaptive EM energy attenuating structure at t=t2, according to an embodiment.

FIG. 3A is a schematic illustration of a sensing system employing a self-adaptive EM energy attenuating structure, according to an embodiment, in a first scene imaging scenario.

FIG. 3B is a schematic illustration of the sensing system employing a self-adaptive EM energy attenuating structure, according to an embodiment, in a second scene imaging scenario.

FIG. 4A is a self-adaptive EM energy attenuating structure, according to an embodiment.

FIG. 4B is a schematic illustration of a self-adaptive EM energy attenuating structure, according to an alternative embodiment.

FIG. 4C is a schematic illustration of self-adaptive EM energy attenuating structure, according to another embodiment.

FIG. 5A is a schematic illustration of an electromagnetic radiation arrangement, according to an embodiment.

FIG. 5B is a schematic illustration of an electromagnetic radiation arrangement, according to an alternative embodiment.

DETAILED DESCRIPTION

Figure 6:
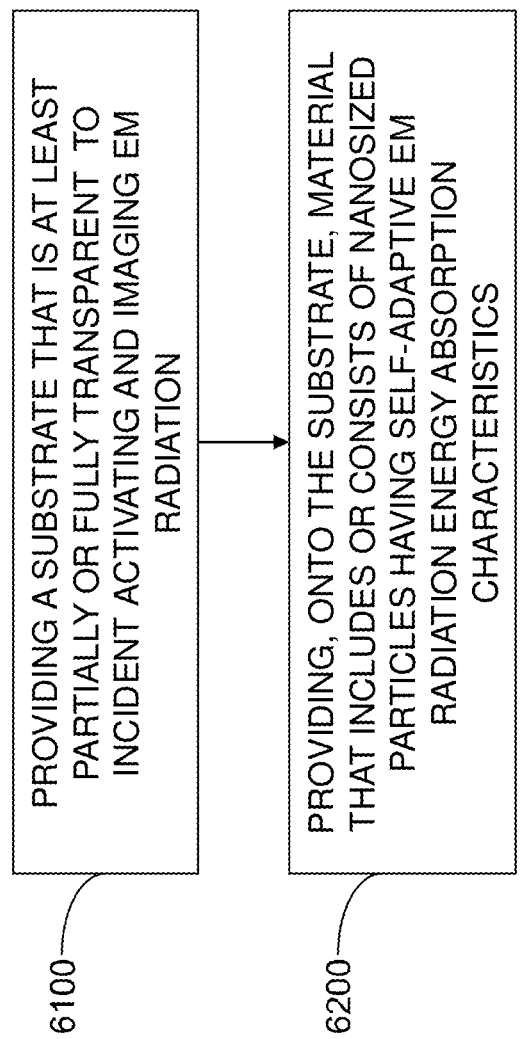
FIG. 6 is a flowchart of a method for manufacturing a self-adaptive attenuating material structure.

The following description of materials, structures, devices, systems and methods is given with reference to particular examples, with the understanding that such materials, structures, devices, systems and methods are not limited to these examples.

Aspects of disclosed embodiments pertain to materials, structures and/or devices that are configured to, operable to, adapted to and/or capable of effecting self-adaptive variable absorption/transmittance characteristics of electromagnetic (EM) radiation, in response to EM radiation incident thereon. Accordingly, the material, optionally comprised in structures, devices and/or systems, may be capable of effecting self-adaptive attenuation of EM radiation incident onto the material, i.e., a ratio between incident EM radiation intensity and output EM radiation intensity that may pass through the material may be self-adaptively altered by the material. For example, the material may be capable of self-adaptively reducing, blocking or increasing the transmission of EM radiation incident thereon.

Merely to simplify the discussion that follows, without be construed in a limiting manner, the expression "self-adaptive variable EM radiation attenuation" may herein be referred to as "self-adaptive EM radiation attenuation".

The self-adaptive EM radiation attenuation characteristics may depend, for example, on material characteristics, characteristics of the structure comprising the material, and/or incident EM radiation characteristics.

It is noted that the term "characteristic(s)" of an object as well as grammatical variations thereof may pertain to extrinsic and/or intrinsic properties of the object. For example, the concentration of nanoparticles in an optically responsive region may be considered to be an extrinsic property, while the atomic weight of an element of the nanoparticle may be considered to be an intrinsic property of that element.

Aspects of disclosed embodiments pertain also to structures and systems comprising such material, as well as to methods utilizing, such structures and/or materials, for example, in imaging, (IR) sensing and/or detecting applications as disclosed herein.

Material having self-adaptive variable EM radiation absorption/attenuation or transmittance characteristics can comprise or consist of nanosized structures and/or particles. The term "material", as used herein, may include one or more constituent substances, compounds and/or compositions. For example, a disclosed material may be mixtures of substances and/or compounds. Optionally, the nanosized particles may include quantum dots (QDs), nanosized semiconductor particles and/or nanocrystals.

It is noted that, herein, the expressions "configured to", "operable to", "adapted to", and "capable of" are interchangeable.

The material, according to some embodiments, comprises or constitutes an optically responsive (also referred to herein as "optically active") region. The optically responsive region may be configured such that when EM radiation of a first wavelength (WL) range is incident thereon in a manner such that it causes excitation of one or more electron-hole pairs in the optically responsive region (also referred to herein as "interband excitation"), the material's absorption/attenuation for incident EM radiation of a second WL range increases, for example, due to intraband transition or excitation.

First WL range EM irradiation having an intensity sufficient to cause interband excitation to enable intraband transition in the second WL range may herein be referred to as "high irradiation intensity", "activation intensity", or similar. Such first WL range EM irradiation may be considered to exceed an activation threshold.

In some examples, EM radiation in the WL1 range incident onto a portion of the material may cause interband excitation or transition, enabling absorption (or increased absorption), by the same portion, EM radiation in the WL2 range due to intraband absorption. The intraband transition or excitation may be caused by the EM radiation in the WL2 range which, in turn, causes increased absorption in the WL2 range.

Conversely, in some embodiments, a reduction or cessation of EM radiation in the first WL range impinging onto the optically responsive region may decrease absorption of EM radiation in the second WL range, e.g., due to a reduction or cessation of interband excitation. Hence, the increase in absorption may be completely or substantially completely reversible. Accordingly, the material or (corresponding portions of) an EM energy attenuating structure comprising such material can be reversibly activated.

As a result of interband excitation, transmittance of the material's optically responsive region to EM radiation in the second WL range may increase. Hence, generally, as the intensity or energy of electromagnetic radiation at a first WL range incident onto the optically responsive region increases, the level of transmittance by the material for electromagnetic radiation at the second WL range may decrease. Conversely, as the intensity for energy of electromagnetic radiation at a first wavelength range incident onto the optically responsive region decreases, the level of transmittance by the material for electromagnetic radiation at the second WL range may increase.

It is noted that the expression "EM radiation of the first WL range (also: WL1 range)" may herein also be referred to as "activating EM radiation", and the expression "EM radiation of the second WL range (also: WL2 range)" may herein also be referred to as the "sensing EM radiation", "sensing WL range". The term "sensing" may include "imaging". In some embodiments, the first wavelength range is different from the second wavelength range. For example, the wavelengths of activating and sensing EM radiation may be non-overlapping, partially overlapping or fully overlapping. In some examples, there may be a gap between the first wavelength range and the second wavelength range.

It is noted that the expression "wavelength range" may in some embodiments also cover applications where most of the light or EM radiation is irradiated at a center frequency (e.g., laser light).

For the purposes of the discussion herein, the expression "normal irradiation intensity" pertains to scenarios where a given sensor is subjected to EM radiation at intensities that are within the sensor's dynamic range. Conversely, the expression "high irradiation intensity" pertains to scenarios where the same sensor is subjected to EM radiation at intensities exceeding the sensor's dynamic range. In some examples, "high intensity radiation" may be at least 1.1, 1.2, 1.3, 1.4, 1.5, 2, 3, 4, 5, or 10-times higher than the upper limit of the sensor's dynamic range.

It is noted that the term "sensor" may relate to electronic sensors, detectors and/or instruments as well as to the retina of an animal or human eye.

The material's response time to activating EM radiation may be in the order of picoseconds, and the relaxation time may be, for example, 1 microsecond or less. In some implementations, the activating EM radiation and the sensing (e.g., imaging) EM radiation may be simultaneously incident onto the material. Optionally, in some implementations, characteristics (e.g., irradiation intensity) of activating and sensing EM radiation emitted by a source of light (e.g., sunlight) may correspond (e.g., correlate with each other). Under certain circumstances, within picoseconds, the activating EM radiation may cause attenuation of incident sensing EM radiation. As disclosed, for example, by FIG. 4 in Guyot-Sionnest P. et al., "Intraband transitions in semiconductor nanocrystals", Appl. Phys. Lett. 72, 686 (1998), which is incorporated by reference in its entirety, the response time of CdSe colloid samples to activating EM radiation and subsequent relaxation time may be in the order of pico-seconds. Shim M. et al., "Long-Lived Delocalized Electron States in Quantum Dots A Step-Scan Fourier Transform Infrared study", J. Phys. Chem. B 104, 1494 (2000) (Shim 2000a), which is incorporated by reference in its entirety, discloses employing an activating light at a pulse of 8 ns. Hence, the response time from transparent to attenuating may be, for example, 1 microsecond or less (e.g., 8 ns).

Relaxation times appear in FIGS. 2 and 4 of Shim 2000a, and they are in the order of 10s of ns up to several micro-seconds.

In some embodiments, the material may be entirely self-adaptive, i.e., EM radiation attenuation characteristics of the material may adapt solely in response to incident EM radiation, without requiring actively changing material characteristics by additional external physical stimulus and/or by chemical modifications. For example, changing material characteristics by subjecting the material to external physical stimulus other than the incident EM radiation may not be necessary. For instance, changing material characteristics in a chemical manner and/or by subjecting the material to an additional source of energy (e.g., thermal, electrical) in addition to subjecting the material to the incident first and second WL EM radiation may not be necessary, as the material may adaptively change its transmittance/absorption characteristics in an entirely self-sufficient manner, depending on the intensity and/or WL of the EM radiation incident onto the optically responsive region.

The intensity of irradiating activating EM radiation may be such that the intensity of sensing EM radiation wavelengths may be attenuated, for example, by at least 10%, by at least 20%, by at least 30%, by at least 40%, by at least 50%, by at least 60%, by at least 70%, by at least 80% or by at least 90%.

In some embodiments, the material may be employed in conjunction with an EM radiation sensor or detector to implement an EM radiation sensing arrangement. In some embodiments, the sensing arrangement comprises EM radiation sensor, and self-adaptive EM energy attenuating material or self-adaptive EM energy attenuating structure comprising such material. The EM energy attenuating structure may comprise material that includes or consists of a plurality of nanoparticles for implementing one or more optically responsive regions as disclosed herein. Optionally, the plurality of particles are structured or arranged as a self-adaptive EM energy attenuating layer configured for implementing one or more optically responsive regions as disclosed herein.

Aspects of disclosed embodiments pertain also to systems comprising EM radiation sensor as well as self-adaptive EM radiation absorption materials and/or structures, which are arranged relative to the EM radiation sensor to self-adaptively attenuate or increase the amount of EM radiation incident onto the sensor.

The EM radiation sensing arrangement may be configured such that the self-adaptive EM energy attenuating structure is positioned between a source of EM radiation which may emit radiation in the first and second WL range (e.g., the sun), and the EM radiation sensor which is configured to, or employed for detecting EM radiation of the second WL range. For example, the self-adaptive EM energy attenuating structure may be positioned downstream of the EM radiation source, and the EM radiation sensing arrangement may be positioned downstream of the self-adaptive EM energy absorption layer.

Due to the self-adaptive characteristics of the material's optically responsive region comprised in the self-adaptive EM energy attenuating structure, the probability to inadvertently cause reversible or irreversible sensor damage (e.g. due to overexposure) through incident high-intensity or otherwise damaging EM radiation of the sensing EM WL range, may be reduced or prevented entirely. This way, the dynamic range of a sensing system employing such EM energy attenuating structure operably in conjunction with an EM radiation sensor can be effectively extended (also: increased), without requiring modification of the dynamic range of the sensor.

The increase in the dynamic range of the sensing system can be utilized in a variety of sensing applications including, for example, for imaging a scene with a given sensor under normal daylight conditions as well as under exposure of direct sunlight; by employing the same sensor for both night vision and daylight vision imaging applications; in thermography applications; in hyperspectral imaging applications; in aerial imaging applications; in spaceborne imaging applications; in terrestrial or space-based astronomy imaging applications; and/or the like.

Although embodiments disclosed herein may mainly pertain to imaging applications, this should by no means be construed as limiting. Accordingly, the increase in dynamic range of sensing systems may also be utilized in additional applications.

It is noted that some (e.g., a small portion, most or all) of the attenuated energy in the sensing EM radiation WL range may later be released via scattering radiation in arbitrary directions. The scattering radiation which may result from attenuating sensing EM radiation can include radiation in the sensing EM radiation WL range or combined first and second EM radiation WLs energies. In some scenarios, not all of the impinging activating EM radiation WL energies may be absorbed by the attenuating structure, and therefore reach the sensor. To prevent from the above-mentioned non-absorbed and/or scattering activating EM radiation to reach the sensor, a filter may be employed to reduce the amount of activating EM radiation reaching the EM radiation sensor, or to prevent activating EM radiation from reaching the (e.g., IR) sensor. Such activating EM radiation filter may therefore be disposed between the EM energy attenuating structure and the sensor.

It is noted that the self-adaptive transmittance/absorption characteristics may be independent of a certain ratio between material thickness and incident WL, i.e., the self-adaptive transmittance/absorption characteristics are not based on wave interference effect. Hence, the material thickness must not necessarily be a certain multiple of incident EM radiation WL to exhibit the self-adaptive transmittance/absorption characteristics described herein.

Optionally, the level of transmittance by the material may decrease, for example, as a result of increased absorption by the material. Analogously, optionally, the level of transmittance by the material may increase, for example, as a result of decreased absorption by the material.

It is noted that expressions such as "increased attenuation" and "decreased transmittance", as well as grammatical variations thereof, may herein be used interchangeably.

Attenuation characteristics of the material or of attenuating material structure may, for example, pertain to attenuation response time for various impinging activating EM radiation wavelengths and intensities; attenuation relaxation time; the difference or ratio between input (also: impinging) sensing EM radiation and obtained output sensing EM radiation; the difference or ratio between input activating EM radiation and output sensing EM radiation; the difference or ratio between input activating and sensing EM radiation. Attenuation obtained for the sensing EM radiation may depend, for example, on the material characteristics, the intensity magnitude of the activating and/or the sensing EM radiation impinging on the attenuating material structure and/or the rate of increase or decrease of EM radiation impinging onto the optically responsive region. In some examples, absorption of the material may increase in correspondence (for example, in correlation) with an increase in impinging (e.g., irradiating) EM radiation intensity.

Correspondingly, absorption of the material may decrease in correspondence (for example, in correlation) with a decrease in impinging (e.g., irradiating) EM radiation intensity. In a yet further example, absorption of the material may decrease in correspondence (for example, in correlation) with decrease EM radiation intensity onto the optically responsive region.

In some embodiments, the material (e.g., the nanosized particles comprised in the material) may be configured such that increased radiation energy of a certain WL range causes reduction in transmittance for the same WL range. This may be the case where the interband excitations and the intraband transitions (also: intraband excitations) are of the same energy.

In some embodiments, the optically active region may be responsive to incident IR radiation which may include visible light; near-infrared radiation (NIR) ranging, for example, from about 0.75 µm to about 1.4 µm; short wave IR radiation (SWIR) ranging, for example, from about 1.4 µm to about 3 µm; mid-wave infrared radiation (MWIR) ranging, for example, from about 3 µm to about 8 µm; and long-wave infrared radiation (LWIR) ranging, for example, from about 8 µm to about 15 µm. Accordingly, the first and/or the second WL (range) may be in the SWIR, MWIR and/or LWIR range.

Table 1 below lists example scenarios of increasing EM radiation intensities impinging on the optically responsive region and, as a result thereof, possible response of the same optically responsive region with respect to decreasing transmittance/increasing absorbance:

TABLE 1

| | Increase in impinging EM irradiation intensity in any one of the following first WL ranges | Resulting decrease in transmittance for any one of the following second WL ranges: |
|---|---|---|
| 1. | Visible Light | Visible Light |
| 2. | Visible Light | NIR |
| 3. | Visible Light | SWIR |
| 4. | Visible Light | MWIR |
| 5. | Visible Light | LWIR |
| 6. | NIR | NIR |
| 7. | NIR | SWIR |
| 8. | NIR | MWIR |
| 9. | NIR | LWIR |
| 10. | SWIR | SWIR |
| 11. | SWIR | MWIR |
| 12. | SWIR | LWIR |
| 13. | MWIR | MWIR |
| 14. | MWIR | LWIR |
| 15. | LWIR | LWIR |

For example, because or as a result of increasing intensity of visible light impinging on the optically responsive region, the transmittance of the same optically responsive region decreases for the NIR, MWIR and/or LWIR range. In another example, because or as a result of increasing MWIR radiation intensity impinging on the optically responsive region, the transmittance of the same optically responsive region may decrease for the LWIR range. In other alternative examples, because or as a result of increasing SWIR, MWIR or LWIR radiation impinging on the optically responsive region, the transmittance of the same optically responsive region may decrease for the SWIR, MWIR or LWIR range, respectively.

In some embodiments, the optically responsive region may comprise or consist a plurality of nanoparticles, for example, one or more types of nanosized particles and/or nanoparticle of the same type but of different sizes and shapes. For example, a nanoparticle may be or may comprise a nanocrystal. A type of nanosized particle may be characterized, for example, by its chemical composition/ components (constituent) and/or the like.

In some embodiments, as already outlined herein, absorption of EM radiation in the first WL range by the optically responsive region can be due to interband electron-hole excitation, and absorption of EM radiation in the second WL range by the optically responsive region can be due to intraband transition or excitation in the conduction band. For example, a decrease in transmittance of EM radiation in the second WL range by the optically responsive region can be due to intraband transition in the conduction band, which may be the result of (e.g., increased) electron-pair excitation in the same optically responsive region due to incident EM radiation thereon in the first WL band.

For instance, interband excitation of an electron from the valence band to an energy level in the conduction band may occur due to absorption of incident EM radiation in the first WL range. As a result of this interband excitation, intraband absorption may occur in which the same electron may be excited to a higher energy level within the conduction band due to absorption in the second WL range. Absent such interband excitation, the optically responsive region may be (substantially) transparent or again become (substantially) transparent to EM radiation in the second WL range. Conversely, in some embodiments, increase in transmittance of EM radiation in the second WL range may be due to a reduction or cessation of interband excitation which may cause, in turn, a reduction in intraband transition in the optically responsive region. Accordingly, the increase in absorption may be reversible, thus allowing repeated use of the same self-adaptive EM energy attenuating structure, for example, in imaging applications, to prevent sensor overexposure or burns.

Reference is now made to FIGS. 1A(i) and 1A(ii). FIG. 1A(i) qualitatively shows a graph of incident radiation energy in, e.g., the MWIR range incident onto an optically responsive region, which comprises an ensemble of QDs, as a function of time, and FIG. 1A(ii) schematically exemplifies a corresponding energy level diagram of interband absorption (arrow a) in a QD of the ensemble of QDS. In the energy level diagram, the electron-hole excitation responsive to incident exciting MWIR radiation is schematically illustrated. It is noted that per cycle of activation and relaxation, each QD may be capable of absorbing only 1 photon of activating EM radiation wavelength. However, if after excitation into the conduction band an absorbing electron is relaxing within the conduction band but not back into the valence band, photons in the sensing EM radiation wavelength may be subjected to multiple absorption by that same electron which is in the conduction band. If an electron is relaxing into the valence band, the cycle of photon absorption is completed for photons in the sensing EM radiation wavelength.

FIG. 1B(i) qualitatively shows the absorbance of the optically responsive region as a function of time for the LWIR range, because or as a result of increasing/decreasing intensity of incident EM radiation in the MWIR range shown in FIG. 1A(i). FIG. 1B(ii) schematically exemplifies a corresponding energy level diagram of intraband transition (arrow b) in the optically responsive region of the material that is subjected to LWIR radiation of increasing intensity.

Reference is now made to FIGS. 2A-2B, exemplifying a situation in which, at time stamp t=t1, a portion or region of self-adaptive EM energy attenuating structure 1100 is solely or primarily subjected to sensing EM radiation 52 emanating from an object (not shown) located in a scene (not shown). The object may be detectable against the scene due to differences in thermal radiation between the object and the ambient temperature of the scene in which the object is located. A remaining portion or region of self-adaptive EM energy attenuating structure 1100 is subjected to both sensing and activating EM radiation 54 emitted from an active EM radiation source 510 (e.g., the sun). FIG. 2A is a schematic back view illustration of self-adaptive EM energy attenuating structure 1100 and FIG. 2B is a schematic side view illustration of self-adaptive EM energy attenuating structure 1100.

The attenuator region that is solely or primarily subjected to sensing EM radiation is herein referred to as first non-activated or inactive optically responsive region or area 1102$i$; and the attenuator region that is subjected to combined activating and sensing EM radiation 54 is herein referred to as first activated optically responsive area or region 1104$i$.

In the example illustrated by FIGS. 2A and 2B, schematically shown for time stamp t=t1, radiation source 510 is only partially covered by the field-of-view of structure 1100. First grayed out responsive region 1104$i$ is schematically designated as the optically active regions (also: activated region or region in activated state) to indicate self-adapted decreased transmittance or increased attenuation by region 1104$i$ to incident sensing EM radiation portion, responsive to increased irradiance of activating EM radiation of the combined activating and sensing EM radiation 54 incident onto the first activated optically responsive region 1104$i$. First "striped" regions 1102$i$ schematically designate optically inactive regions which are not activated with respect to attenuation or absorbance of incident EM radiation thereon.

In the situation exemplified in FIGS. 2C-D, schematically shown for time stamp t=t2>t1, sensing EM radiation 52 is primarily incident onto a second "striped" non-activated optically responsive region or area 1102$ii$; and combined activating and sensing EM radiation 54 is primarily incident onto a second "grayed out" attenuator region 1104$ii$ of the structure. In the example illustrated by FIGS. 2C and 2D, radiation source 510 is fully covered by the field-of-view of structure 1100.

Analogous to FIGS. 2A and 2B, second "grayed out" attenuator region 1104$ii$ designates a region with self-adapted decreased transmittance to the portion of sensing EM radiation of the combined activated and sensing EM radiation incident onto second attenuator region 1104$ii$, responsive to increased irradiance of activating EM radiation onto second activated optically responsive region 1104$ii$, and striped region 1102$ii$ schematically designate optically responsive areas of the attenuator material structure 100 which are not affected by incident activating EM radiation with respect to transmittance or absorbance of incident sensing EM radiation.

According to some embodiments, an optically responsive material of the self-adaptive EM energy attenuating structure may be implemented by a plurality of nanoparticles optionally stacked in one or more layers, and/or being part of a multiphase material such as a bulk matrix having nano-dimensional phases which may differ from the bulk matrix in structure and/or chemistry and/or other characteristics. For example, the plurality of nanoparticles may be dispersed in a matrix (e.g., a sol-gel) within the multiphase material.

In some embodiments, a contemplated self-adaptive EM energy absorption layer may comprise or consist of multiphase material. Optionally, the self-adaptive EM energy attenuating structure may comprise a plurality of self-adaptive EM energy absorption layers, which may be the same or different. In some embodiments, at least two of the layers are made of different materials.

Non-limiting example of nanosized particles include nanoparticles comprised of, HgS and/or HgSe. Example manufacturing methods and example structure and/or characteristics (e.g., size ranges, geometries, EM wavelength response, absorption values, etc.) of nanosized particles are disclosed, for instance, in Shim M. et al., "n-type colloidal semiconductor nanocrystals", Nature 407, 981 (2000); Jeong K. S. et al., "Air-Stable n-Doped colloidal HgS quantum dots", J. Phys. Chem. Lett. 5, 1139 (2014); and Lhuillier E. et al., "Infrared Photodetection Based on Colloidal Quantum-Dot Films with High Mobility and Optical Absorption up to THz", Nano Lett. 16, 1282 (2016), all of which are incorporated by reference in their entirety.

According to some embodiments, a nanosized particle can have various shapes including, for example, a quantum dot, rod, platelet, prism, disk, wire, tube, tetrapod, cube, sphere, faceted sphere, cone, polyhedron (e.g., tetrahedron), bar, monopod, bipod, tripod, star, octopod, hemisphere, urchin, filamentous nanoparticle, biconcave discoid, necklace, chain, plate triangle, square, pentagon, hexagon, ring, tetrahedron, truncated tetrahedron, or combination thereof. The nanosized particle can also come in a form of core-shell structure for the sake of protection and/or to effect corresponding self-adaptive functionality that is characteristic of such core-shell configuration.

Further reference is made to FIGS. 3A-B. According to some embodiments, a sensing (e.g., imaging) system 3000 that employs EM energy attenuating structure 1100 may comprise optics 3100 that is operable to image one or more objects 520 of a scene 500.

Optics 3100 may comprise at least one optical element (e.g., lenses) 3102 configured to direct light onto EM energy attenuating structure 1100 and further onto a sensor 3200. Optics 3100 may further comprise a spectral filter 3104 configured to filter out unwanted wavelength ranges received from scene 500 to obtain, downstream of spectral filter 3104, (e.g., mainly or only) EM radiation at activating wavelength ranges WL1, and further EM radiation (e.g., mainly or only) at sensing ranges WL2. Hence, in some embodiments, spectral filter 3104 may be configured to not only let pass therethrough EM radiation in the sensing range WL2 but also to let pass therethrough EM radiation in the activating sensing range WL1, while filtering out all (also: substantially all) other wavelength ranges entering sensing system 3000 from scene 500. Correspondingly, optics 3100 may be configured such that (e.g., mainly or only) EM radiation of both first and second ranges WL1 and WL2 is incident onto EM energy attenuating structure 1100.

Spectral filter 3104 may be configured to exhibit or have a sensing range WL2 transmissivity of, for example, at least 70%, at least 80%, at least 90%, at least 95%, or at least 98%. In some examples, spectral filter 3104 may be configured to exhibit or have a sensing range WL2 transmissivity of substantially or almost 100%. In other words, in some examples spectral filter 3104 may be configured to be substantially or completely transparent to EM radiation in the sensing range WL2. Embodiments of sensing or sensing systems disclosed herein may be employable in EM radiation sensing applications involving coherent (e.g., laser) light, incoherent light. Such EM radiation sensing applications may include, for example, infrared imaging in daylight.

EM energy attenuating structure 1100 may be configured to exhibit, in an inactivated state a sensing range WL2 transmissivity of, for example, at least 70%, at least 80%, at least 90%, at least 95%, or at least 98%. In some examples, EM energy attenuating structure 1100 may be configured to have, in an inactivated state, a transmissivity to EM radiation in the sensing range WL2 of substantially or almost 100%. In other words, in some examples, spectral filter 3104 may be configured to be substantially or completely transparent to EM radiation in the sensing range WL2.

In some examples, spectral filter 3104 may be configured to act as a dichroic filter implemented, for example, by an interference filter.

FIG. 3A schematically exemplifies a first scenario of sensing (e.g., imaging) radiation from scene 500 under daylight conditions where no direct sunlight enters the field-of-view (FOV) of optics 3100. In such first scenario, light entering optics 3100 may herein be considered to be at "normal intensity". For example, sensing system 3000 may be employed for the detection of objects located behind clouds (not shown).

In the scenario shown in FIG. 3A, EM attenuating structure 1100 may be configured to reduce or prevent from normal intensity EM radiation in the activating range WL1 to pass therethrough, yet let pass normal intensity EM radiation at the imaging range WL2 to reach sensor 3200. Hence, in the first scenario, downstream of EM energy attenuating structure 1100, (e.g., mainly or only) unattenuated (also: substantially unattenuated) normal intensity imaging radiation WL2 may propagate towards sensor 3200. In some embodiments, an additional filter may be employed between the attenuating structure 1100 and sensor 3200 to reduce or prevent from (residual) EM radiation in the activating range WL1 to reach sensor 3200.

In some other examples, EM attenuating structure 1100 may be configured to let pass therethrough both normal intensity EM radiation in the activating range WL1 and the imaging range WL2 to reach sensor 3200. In some examples of the first scenario, downstream of EM energy attenuating structure 1100, (e.g., mainly or only) unattenuated (also: substantially unattenuated) normal intensity EM radiation in the activating wavelength range WL1 as well as in the imaging wavelength range WL2 may propagate towards sensor 3200.

FIG. 3B schematically exemplifies a scenario of imaging a scene under daylight conditions where portions of high intensity radiation or light (e.g., direct sunlight) enter optics 3100. This may for example occur due to movement of clouds unblocking the sun and/or due to through traversing or panning of sensing system 3000 for the purpose of scanning a scene. As noted above, optics 3100 is configured to guide, e.g., via at least one optical element 3102, high intensity radiation onto spectral filter 3104 and further via EM attenuating structure 1100 onto sensor 3200. High intensity EM radiation entering sensing system 3000 is filtered by spectral filter 3104 to obtain, downstream of spectral filter 3104, (e.g., mainly or only) high intensity EM radiation in the activating range WL1 and the imaging range WL2 to propagate towards EM attenuating structure 1100.

High intensity EM radiation in the activating range WL1 incident onto EM attenuating structure 1100 causes activation of a corresponding portion of EM attenuating structure 1100 where the high intensity EM radiation is imaged. The activated portion of EM attenuating structure 1100 causes attenuation of high intensity EM radiation of the imaging range WL2 incident thereon to obtain, downstream of the EM attenuating structure 1100, attenuated EM radiation in the imaging range WL2. Attenuated (high intensity) EM radiation in the sensing range WL2 may be within the dynamic range of sensor 3200. Accordingly, by employing EM attenuating structure 1100, the dynamic range of sensing system 3000 is effectively increased, allowing imaging of scene 500 under both normal and high intensity (e.g., direct sunlight) lighting conditions, for example, without requiring sensor modification. In some embodiments, attenuating structure 1100 may be configured to reduce or prevent from activating range WL1 that may pass through the structure to reach sensor 3200. In some embodiments, an additional filter may be employed between the attenuating structure 1100 and sensor 3200 to reduce or prevent from activating range WL1 to reach sensor 3200.

In some examples of the second scenario, portions of high intensity activating EM radiation may reach the sensor. In examples, a filter may be employed to prevent portions of high intensity activating EM radiation from reaching the sensor. In some embodiments, the EM energy attenuating structure may filter high intensity activating EM radiation.

Additional reference is now made to FIGS. 4A-C. As shown schematically in FIG. 4A, a self-adaptive EM energy attenuating structure 1100A may in some embodiments comprise a self-adaptive EM energy absorption layer 1110A comprising material 1112 which is arranged (e.g., through self-assembly precipitation or provided otherwise) onto a substrate 1120. The material includes or consists of nano-sized particles 1112 having self-adaptive EM radiation energy absorption characteristics. Optionally, the nanosized particles are provided as monolayers or multilayers (as exemplified in FIG. 4A) onto substrate 1120. Optionally, a protective coating layer 1114 may be provided for protecting the nanosized particles 1112 from operationally adverse environmental conditions and/or processes such as, for example, oxidization.

As shown schematically in FIG. 4B, a self-adaptive EM energy attenuating structure 1100B may comprise, in some embodiments, a layer 1110B comprising nanoparticles 1112 which are dispersed within a matrix 1116 that is arranged on substrate 1120.

As shown schematically in FIG. 4C, a self-adaptive EM energy attenuating structure 1100C may comprise nanoparticles 1112 that are dispersed within matrix 1116 to form a layer 1110C which is sandwiched between two substrate layers 1120 and 1122. Optionally, matrix 1116 may be an adhesive, for example, to adhere the two substrate layers 1120 and 1122 to each other.

The substrate material and the matrix (e.g., adhesive) may be, at least partially, transparent to the incident activating (e.g., MWIR) and the sensing (e.g., LWIR) EM radiation. For example, the substrate material may comprise Germanium and/or Cleartran® Zincsulfide, etc.

Example matrix materials that may be employed may include, for example, Aron Alpha No. 201®; Zipond contact Cem®; Loctite 307®; M-Bond 610®; Stycast 35D®; Eastman 910®; Eastman Kodak HE-100X®; Eastman Kodak HE-5-1®; Eastman Kodak HE-79®; and/or Aron Alpha NO. 101®, etc.

For the attenuator to be effective to enable sufficient attenuation, the thickness of the optically active region may have to have a certain minimum thickness.

For example, if QDs are laid on a substrate, for example by means of self-assembly or precipitation, the active region thickness would be a few monolayers of the QDs, for instance, in the order of 100 nm.

In another example where the QDs are dispersed in a matrix which is coated onto the substrate, the active layer thickness may be in the order of, for example, about 1 micron to about 30 microns. In all examples, the substrate thickness may range, for example, from about 0.1 mm to a few mm (e.g., 5 mm).

In some embodiments, depending on the damage threshold of the attenuator configuration, there may be an upper limit for incident energy below which the attenuator is operable or effective.

Additional reference is made to FIGS. 5A and 5B, schematically illustrating various embodiments of an EM sensing arrangement 5000. As shown in FIG. 5A, an EM sensing arrangement 5000A may comprise a self-adaptive EM energy attenuating structure 1100 for attenuating incident sensing EM radiation 52 responsive to incident activating EM radiation 54 originating from an EM radiation source, and an EM radiation sensor 3200 for sensing (optionally at least partially attenuated) sensing EM radiation 52 that passes through EM energy attenuating structure 1100. Optionally, as shown in FIG. 5A, self-adaptive EM energy attenuating structure 1100 may directly engage with EM radiation sensor 3200. Optionally, as schematically shown in FIG. 5B of an EM sensing arrangement 5000B, a filter 5100 may be disposed between self-adaptive EM energy attenuating structure 1100 and EM radiation sensor 3200, for example, for filtering out activating EM radiation WL1, to reduce or prevent activating EM radiation from reaching EM radiation sensor 3200. Optionally, the EM attenuating structure may be configured to filter out activating EM radiation in the WL1 range, to prevent from activation EM radiation to reach the sensor. Optionally, spacer layers (not shown) may be disposed between EM energy attenuating structure.

In some embodiments, EM radiation sensor 3200 may comprise a plurality of pixel elements 3210 for implementing an imaging or other type of sensor.

Additional reference is made to FIG. 6. A method for manufacturing a self-adaptive attenuating material structure may comprise, for example, providing a substrate that is at least partially or fully transparent to incident activating (e.g., MWIR) and imaging (e.g., LWIR) EM radiation (block 6100).

The method may further comprise providing, onto the substrate, material that includes or consists of nanosized particles 1112 having self-adaptive EM radiation energy absorption characteristics (block 6200).

Figure 7:
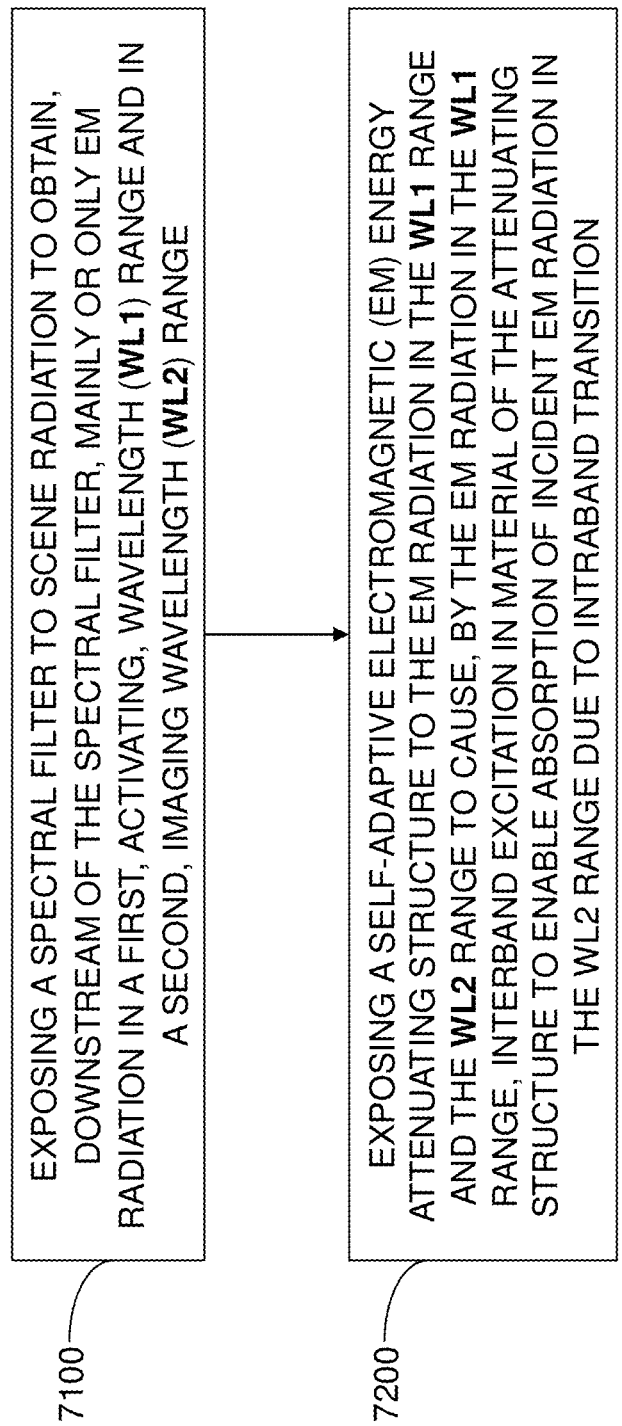
FIG. 7 is a flowchart of a method for sensing EM radiation.

Further referring to FIG. 7, a method for sensing EM radiation may include exposing or subjecting a spectral filter to scene radiation to obtain, downstream of the spectral filter, (e.g., mainly or only) EM radiation in a first, activating, wavelength (WL1) range and in a second, sensing wavelength (WL2) range (block 7100).

The method may further comprise exposing or subjecting a self-adaptive electromagnetic (EM) energy attenuating structure to the EM radiation in the WL1 range and the WL2 range to cause, by the EM radiation in the WL1 range, interband excitation in material of the attenuating structure to enable absorption of incident EM radiation in the WL2 range due to intraband transition. In some examples, high intensity EM radiation in the WL1 range causes interband excitation, thereby enabling (increased) absorption of high intensity EM radiation in the WL2 range. The interband excitation may enable intraband transition. Increased absorption in the WL2 range may be due to the enabled intraband transition.

Additional Examples

Example 1 pertains to a sensing system configured to receive scene electromagnetic (EM) radiation comprising a first wavelength (WL1) range and a second wavelength (WL2) range, the sensing system comprising:

at least one spectral filter configured to filter the received scene EM radiation to obtain, downstream of the at least one spectral filter, (e.g., mainly or only) EM radiation in the WL1 range and the WL2 ranges; and a self-adaptive EM energy attenuating structure configured to receive from the at least one spectral filter the EM radiation in the WL1 range and the WL2 range, wherein the self-adaptive EM energy attenuating structure is further configured such that high intensity EM radiation at the WL1 range incident onto a portion of the self-adaptive EM energy attenuating structure causes interband excitation of one or more electron-hole pairs to enable intraband transition by EM radiation in the WL2 range in the portion of the self-adaptive EM energy attenuating structure, wherein intraband transition enables absorption or increases absorption of high intensity EM radiation in the WL2 range by the portion of the self-adaptive EM energy attenuating structure.

Example 2 includes the subject matter of Example 1 and, optionally, wherein EM radiation in the WL1 range is used for activation, and EM radiation in the WL2 range is used for imaging.

Example 3 includes the subject matter of Example 1 or Example 2, wherein the self-adaptive EM energy attenuating structure comprises material that includes nanosized particles.

Example 4 includes the subject matter of Example 3 and, optionally, wherein the nanosized particles are configured such that high intensity EM radiation at the WL1 range incident onto a portion of the self-adaptive EM energy attenuating structure causes interband excitation of one or more electron-hole pairs, enabling intraband transition in the portion of the self-adaptive EM energy attenuating structure, wherein intraband transition increases absorption of high intensity EM radiation of the WL2 range by the portion of the self-adaptive EM energy attenuating structure.

Example 5 includes the subject matter of any one or more of the Examples 1 to 4 and, optionally, wherein the increased absorption of high intensity EM radiation in the WL2 range reduces (the risk) or prevents overexposure (e.g., sunburns) of a corresponding portion of an EM radiation sensor of the sensing system.

Example 6 includes the subject matter of any one or more of the Examples 3 to 5, wherein the self-adaptive EM energy attenuating structure comprises one or more self-adaptive EM energy attenuating layers comprising the nanosized particles.

Example 7 includes the subject matter of Example 6 and, optionally, wherein the one or more self-adaptive EM energy attenuating layers include nanosized particles arranged in a monolayer or in multilayers.

Example 8 includes the subject matter of Example 6 or Example 7 and, optionally, wherein the one or more self-adaptive EM energy attenuating layers comprise nanosized particles which are dispersed within a matrix.

Example 9 includes the subject matter of any one or more of the Examples 6 to 8 and, optionally, wherein the one or more layers are arranged on a substrate.

Example 10 includes the subject matter of any one or more of the Examples 6 to 9 and, optionally, wherein the one or more layers are sandwiched between two substrate layers.

Example 11 the subject matter of any one or more of the Examples 6 to 10 and, optionally, wherein the material is configured such that as the intensity or energy of electromagnetic radiation at a first WL range decreases, the absorption by the material, of electromagnetic radiation of the second WL range, decreases.

Example 12 includes the subject matter of any one or more of the Examples 1 to 11 and, optionally, further comprising a filter that is disposed between the self-adaptive EM energy attenuating structure and the EM radiation sensor, the filter being configured to filter out activating EM radiation, to reduce or prevent the EM radiation of the first WL range from reaching the EM radiation sensor.

Example 13 includes the subject matter of any one or more of the Examples 1 to 12 and, optionally, wherein the self-adaptive EM energy attenuating structure is free of a circuit configured to readout signals relating to EM radiation incident onto the structure.

Example 14 includes the subject matter of any one or more of the Examples 1 to 13 and, optionally, wherein the nanosized particles include quantum dots (QDs), nanosized semiconductor particles and/or nanocrystals.

Example 15 includes the subject matter of any one or more of the Examples 1 to 14 and, optionally, wherein the first WL range at least partially overlaps the second WL range; or wherein the second WL range is comprised in the first WL range; or wherein the first WL range does not overlap the second WL range of EM radiation.

Example 16 includes the subject matter of any one or more of the Examples 1 to 15 and, optionally, further comprising a sensor arranged in an image plane of the radiation sensing system.

Example 17 pertains to a method for manufacturing a sensing system according to any one or more of the examples 1 to 16 and, optionally, further comprising:

providing at least one spectral filter configured to filter received scene EM radiation to obtain, downstream of the at least one spectral filter, (e.g., mainly or only) EM radiation in the WL1 range and the WL2 ranges; and providing a self-adaptive EM energy attenuating structure that is configured such that incident EM radiation of a first wavelength (WL) range thereon causes excitation of one or more electron-hole pairs, enabling absorption of incident EM radiation in a second WL range. The absorption of the incident EM radiation in the WL2 range by the material reduces risk or prevents for example overexposure and/or sunburns of the EM radiation sensor.

Example 18 pertains to a method for increasing the dynamic range of a sensing system and/or for preventing overexposure and/or sunburns to a sensor of the sensing system, the method comprising:

exposing a spectral filter to scene radiation to obtain, downstream of the spectral filter, EM radiation in a first, activating, wavelength (WL1) range and in a second, sensing (e.g., imaging) wavelength (WL2) range; and exposing a self-adaptive electromagnetic (EM) energy attenuating structure to the EM radiation in the WL1 range and the WL2 range, wherein the self-adaptive (EM) energy attenuating structure is configured such that EM radiation in the first WL1 range incident onto a portion of the self-adaptive electromagnetic energy attenuating structure causes interband excitation to enable, by the portion of the self-adaptive electromagnetic energy attenuating structure, absorption of incident EM radiation in the second WL2 range.

Example 19 includes the subject matter of Example 18 and, optionally, comprising activation of material by the EM radiation in the WL1 range, wherein the material is included in the EM energy attenuating structure, and sensing radiation from (e.g., imaging) a scene by the EM radiation in the WL2 range.

Example 20 includes the subject matter of Examples 18 or 19 and, optionally, wherein the increased absorption reduces or prevents overexposure or sunburns of a corresponding portion of an EM radiation sensor configured to sense EM radiation in the WL2 range.

Example 21 includes the subject matter of Examples 19 or 20 and, optionally, wherein the material that includes nanosized particles which are configured such that EM radiation in the first WL1 range incident onto a portion of the a self-adaptive electromagnetic energy attenuating structure causes excitation of one or more electron-hole pairs in the self-adaptive electromagnetic energy attenuating structure, thereby enabling absorption or significantly increased absorption, by the portion of the self-adaptive electromagnetic energy attenuating structure, of incident EM radiation of in the second WL2 range. The absorption reduces the risk or prevents overexposure (e.g., sunburns) of a corresponding portion of an EM radiation sensor. The EM radiation sensor is configured to receive EM radiation passing through the self-adaptive electromagnetic energy attenuating structure.

Example 22 includes the subject matter of any one or more of the Examples 18 to 21 and, optionally, wherein increased absorption of electromagnetic radiation at the second WL range can be due to intraband transition.

Example 23 includes the subject matter of any one or more of the Examples 18 to 22 and, optionally, wherein the self-adaptive EM energy attenuating structure comprises one or more self-adaptive EM energy attenuating layers comprising the nanosized particles.

Example 24 includes the subject matter of Example 23 and, optionally, wherein the one or more self-adaptive EM energy attenuating layers include the nanosized particles which are arranged in a monolayer or in multilayers.

Example 25 includes the subject matter of Examples 23 or 24 and, optionally, wherein the nanosized particles are dispersed within a matrix.

Example 26 includes the subject matter of any one or more of the Examples 23 to 25 and, optionally, wherein the one or more layers are arranged on a substrate.

Example 27 includes the subject matter of any one or more of the Examples 23 to 26 and, optionally, wherein the one or more layers are sandwiched between two substrate layers.

Example 28 includes the subject matter of any one or more of the Examples 19 to 27 and, optionally, wherein the material is configured such that as the intensity or energy of electromagnetic radiation at a first WL range decreases, the absorption by the material, of electromagnetic radiation of the second WL range, decreases.

Example 29 includes the subject matter of any one or more of the Examples 19 to 28 and, optionally, further comprising reducing or preventing from the EM radiation of the first WL range from reaching the EM radiation sensor by a filter that is disposed between the self-adaptive EM energy attenuating structure and the EM radiation sensor.

Example 30 pertains to material that is configured such that incident electromagnetic (EM) radiation of a first wavelength (WL) range thereon causes interband excitation of one or more electron-hole pairs in the material, thereby enabling absorption or increasing absorption, by the material, of incident EM radiation of a second WL range. The interband excitation enables intraband transition in the material by the second WL range. Intraband transition causes absorption of the EM radiation in the second WL range.

Example 31 includes the subject matter of Example 30 and, optionally, wherein as the intensity or energy of electromagnetic radiation at a first WL range decreases, the absorption of material of electromagnetic radiation for the second WL range decreases.

Example 32 includes the subject matter of Example 30 or 31 and, optionally, wherein the level of transmittance by the material decreases because of increased absorption by the material.

Example 33 includes the subject matter of any one or more of the Examples 30 to 32 and, optionally, wherein, comprising one or more types of nanosized particles, wherein a type of nanosized particle is defined by its material, size and/or shape.

Example 34 includes the subject matter of any one or more of the Examples 30 to 33 and, optionally, wherein the material comprises or consists of a plurality of nanocrystals.

Example 35 includes the subject matter of any one or more of the Examples 30 to 34 and, optionally, wherein absorption of electromagnetic radiation at the first WL range can be due to interband electron-hole excitation.

Example 36 includes the subject matter of any one or more of the Examples 30 to 35 and, optionally, wherein absorption of electromagnetic radiation at the second WL range can be due to intraband transition or excitation in the conduction band.

Example 37 includes the subject matter of any one or more of the Examples 30 to 36 and, optionally, wherein the first WL range at least partially overlaps the second WL range of electromagnetic radiation.

Example 38 includes the subject matter of any one or more of the Examples 30 to 37 and, optionally, wherein the second WL range is comprised in the first WL range of electromagnetic radiation.

Example 39 includes the subject matter of any one or more of the Examples 30 to 38, wherein the first WL range does not overlap the second WL range of electromagnetic radiation.

Example 40 includes the subject matter of any one or more of the Examples 30 to 39 and, optionally, wherein the electromagnetic radiation at the first WL range comprises visible light, and/or near-infrared, and/or short WL infrared, and/or mid WL infrared radiation; and wherein the electromagnetic radiation at the second WL range for which transmittance is reduced comprises mid-WL infrared radiation and/or long-wavelength infrared radiation.

Example 41 pertains to an EM radiation sensing system, comprising: an EM radiation sensor operable to detect the electromagnetic radiation at the second WL range; and material of any one or more of the Examples 30 to 40 which is arranged relative to the EM radiation sensor to prevent sensor overexposure.

In the discussion, unless otherwise stated, adjectives such as "substantially" and "about" that modify a condition or relationship characteristic of a feature or features of an embodiment of the invention, are to be understood to mean that the condition or characteristic is defined to within tolerances that are acceptable for operation of the embodiment for an application for which it is intended. For example, the expression "substantially transparent" may for instance mean that 10% or less; or 5% or less; or 1% or less, of the incident EM radiation may be absorbed by the optically responsive regions.

It is important to note that the method may include is not limited to those diagrams or to the corresponding descriptions. For example, the method may include additional or even fewer processes or operations in comparison to what is described in the figures. In addition, embodiments of the method are not necessarily limited to the chronological order as illustrated and described herein.

Where the claims or specification refer to "a" or "an" element and/or feature, such reference is not to be construed as there being only one of that element. Hence, reference to "an element" or "at least one element" for instance may also encompass "one or more elements".

Terms used in the singular shall also include the plural, except where expressly otherwise stated or where the context otherwise requires.

In the description and claims of the present application, each of the verbs, "comprise" "include" and "have", and conjugates thereof, are used to indicate that the object or objects of the verb are not necessarily a complete listing of components, elements or parts of the subject or subjects of the verb.

As used herein, if a machine (e.g., a controller, or a processor in conjunction with a memory) is described as "operable to" perform a task, then, at least in some embodiments, the machine may include components, parts, or aspects (e.g., software) that enable the machine to perform a particular task. In some embodiments, the machine may perform this task during operation. Similarly, when a task is described as being done "in order to" establish a target result, then, at least in some embodiments, carrying out the task may accomplish the target result.

It is noted that the terms "operable to" can encompass the meaning of the term "adapted or configured to". In other words, a machine "operable to" perform a task can in some embodiments, embrace a mere capability (e.g., "adapted") to perform the function and, in some other embodiments, a machine that is actually made to (e.g., "configured") to perform the function.

Unless otherwise stated, the use of the expression "and/or" between the last two members of a list of options for selection indicates that a selection of one or more of the listed options is appropriate and may be made, and may be used interchangeably with the expressions "at least one of the following", "any one of the following" or "one or more of the following", followed by the listing of the options.

It is appreciated that certain features of the invention, which are, for clarity, described in the context of separate embodiments or example, may also be provided in combination in a single embodiment. Conversely, various features of the invention, which are, for brevity, described in the context of a single embodiment, example and/or option, may also be provided separately or in any suitable sub-combination or as suitable in any other described embodiment, example or option of the invention. Certain features described in the context of various embodiments, examples and/or optional implementation are not to be considered essential features of those embodiments, unless the embodiment, example and/or optional implementation is inoperative without those elements.

It is noted that the term "exemplary" is used herein to refer to examples of embodiments and/or implementations, and is not meant to necessarily convey a more-desirable use-case.

The number of elements shown in the Figures should by no means be construed as limiting and is for illustrative purposes only.

Throughout this application, various embodiments may be presented in and/or relate to a range format. It should be understood that the description in range format is merely for convenience and brevity and should not be construed as an inflexible limitation on the scope of the embodiments. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Where applicable, whenever a numerical range is indicated herein, it is meant to include any cited numeral (fractional or integral) within the indicated range.

The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals there between.

While the invention has been described with respect to a limited number of embodiments, these should not be construed as limitations on the scope of the invention, but rather as exemplifications of some of the embodiments.

What is claimed is:

1. A sensing system configured to receive scene electromagnetic (EM) radiation comprising a first wavelength (WL1) range and a second wavelength (WL2) range that is different from the WL1 range, the sensing system comprising:
    at least one spectral filter configured to filter the received scene EM radiation to obtain, downstream of the at least one spectral filter, EM radiation in the WL1 range and the WL2 range; and
    a self-adaptive EM energy attenuating structure configured to receive from the at least one spectral filter the EM radiation in the WL1 range and the WL2 range,
    wherein the self-adaptive EM energy attenuating structure is further configured such that high intensity EM radiation at the WL1 range incident onto a portion of the self-adaptive EM energy attenuating structure, at an activation intensity exceeding an activation threshold, causes interband excitation of one or more electron-hole pairs to enable intraband transition by EM radiation in the WL2 range in the portion of the self-adaptive EM energy attenuating structure, thereby enabling absorption of high intensity EM radiation in the WL2 range by the portion of the self-adaptive EM energy attenuating structure.

2. The sensing system of claim 1, wherein EM radiation in the WL1 range is used for activation, and EM radiation in the WL2 range is used for imaging.

3. The sensing system of claim 1, wherein the self-adaptive EM energy attenuating structure comprises material that includes nanosized particles.

4. The sensing system of claim 3, wherein the nanosized particles are configured such that high intensity EM radiation at the WL1 range incident onto a portion of the self-adaptive EM energy attenuating structure causes interband excitation of one or more electron-hole pairs, enabling intraband transition in the portion of the self-adaptive EM energy attenuating structure, wherein intraband transition increases absorption of high intensity EM radiation of the WL2 range by the portion of the self-adaptive EM energy attenuating structure.

5. The sensing system of claim 3, wherein the self-adaptive EM energy attenuating structure comprises one or more self-adaptive EM energy attenuating layers comprising the nanosized particles.

6. The sensing system of claim 5, wherein the one or more self-adaptive EM energy attenuating layers include nanosized particles arranged in a monolayer or in multilayers.

7. The sensing system of claim 5, wherein the one or more self-adaptive EM energy attenuating layers comprise nanosized particles which are dispersed within a matrix.

8. The sensing system of claim 3, wherein the material is configured such that as the intensity or energy of electromagnetic radiation at a first WL range decreases, the absorption by the material, of electromagnetic radiation of the second WL range, decreases.

9. The sensing system of claim 1, wherein the increased absorption of high intensity EM radiation in the WL2 range reduces a risk or prevents overexposure (e.g., sunburns) of a corresponding portion of an EM radiation sensor of the sensing system.

10. The sensing system of claim 1, further comprising a filter that is disposed between the self-adaptive EM energy attenuating structure and an EM radiation sensor, the filter being configured to filter out activating EM radiation, to reduce or prevent the EM radiation of the first WL range from reaching the EM radiation sensor.

11. The sensing system of claim 1, wherein the self-adaptive EM energy attenuating structure is free of a circuit configured to readout signals relating to EM radiation incident onto the structure.

12. The sensing system of claim 1, wherein the nanosized particles include quantum dots (QDs), nanosized semiconductor particles and/or nanocrystals.

13. The sensing system of claim 1, wherein the first WL range at least partially overlaps the second WL range;
    or wherein the second WL range is comprised in the first WL range;
    or wherein the first WL range does not overlap the second WL range of EM radiation.

14. The sensing system of claim 1, further comprising a sensor configured to be arranged in an image plane of the radiation sensing system.

15. A method for manufacturing a sensing system, comprising:
    providing at least one spectral filter configured to filter received scene EM radiation to obtain, downstream of the at least one spectral filter, EM radiation in the WL1 range and the WL2 ranges; and
    providing a self-adaptive EM energy attenuating structure that is configured such that incident EM radiation of a first wavelength (WL) range thereon, at an activation intensity exceeding an activation threshold, causes excitation of one or more electron-hole pairs, enabling increasing absorption of incident EM radiation in a second WL range,
    wherein the increased absorption of the incident EM radiation in the WL2 range by the material reduces the risk or prevents overexposure and/or sunburns of the EM radiation sensor.

16. A method for sensing EM radiation, the method comprising:
    exposing a spectral filter to scene radiation to obtain, downstream of the spectral filter, EM radiation in a first, activating, wavelength (WL1) range and in a second, sensing wavelength (WL2) range that is different from the WL1 range;

exposing a self-adaptive electromagnetic (EM) energy attenuating structure to the EM radiation in the WL1 range and the WL2 range, wherein the self-adaptive (EM) energy attenuating structure is configured such that EM radiation in the first WL1 range incident onto a portion of the self-adaptive electromagnetic energy attenuating structure, at an activation intensity exceeding an activation threshold, causes interband excitation to enable, by the portion of the self-adaptive electromagnetic energy attenuating structure, absorption of incident EM radiation in the second WL2 range.

17. The method of claim 16, comprising:

activation of material by the EM radiation in the WL1 range, wherein the material is included in the EM energy attenuating structure, and sensing radiation from a scene by the EM radiation in the WL2 range.

18. The method of claim 17, wherein the material includes nanosized particles which are configured such that EM radiation in the first WL1 range incident onto a portion of the a self-adaptive electromagnetic energy attenuating structure causes excitation of one or more electron-hole pairs in the self-adaptive electromagnetic energy attenuating structure, enabling increasing absorption, by the portion of the self-adaptive electromagnetic energy attenuating structure, incident EM radiation of in the second WL2 range to reduce the risk or prevents overexposure or sunburns of a corresponding portion of an EM radiation sensor configured to receive EM radiation passing through the self-adaptive electromagnetic energy attenuating structure.

19. The method of claim 16, wherein the increased absorption reduces or prevents overexposure or sunburns of a corresponding portion of an EM radiation sensor configured to sense EM radiation in the WL2 range.

20. The method of claim 16, further comprising reducing or preventing from the EM radiation of the first WL range from reaching the EM radiation sensor by a filter that is disposed between the self-adaptive EM energy attenuating structure and the EM radiation sensor.

* * * * *